US006962297B2

(12) United States Patent
Kienzler et al.

(10) Patent No.: US 6,962,297 B2
(45) Date of Patent: Nov. 8, 2005

(54) PIEZOELECTRIC ACTUATOR MODULE

(75) Inventors: Dieter Kienzler, Leonberg (DE); Werner Scholten, Stuttgart (DE); Dietmar Uhlmann, Korb (DE); Jean-Luc Loutrage, Schellenbronn (DE)

(73) Assignee: Robert Bosch GmbH, Stuttgart (DE)

( * ) Notice: Subject to any disclaimer, the term of this patent is extended or adjusted under 35 U.S.C. 154(b) by 96 days.

(21) Appl. No.: 10/296,583

(22) PCT Filed: Feb. 14, 2002

(86) PCT No.: PCT/DE02/00517

§ 371 (c)(1),
(2), (4) Date: Apr. 18, 2003

(87) PCT Pub. No.: WO02/084107

PCT Pub. Date: Oct. 24, 2002

(65) Prior Publication Data

US 2003/0164405 A1 Sep. 4, 2003

(30) Foreign Application Priority Data

Apr. 14, 2001 (DE) ........................................ 101 18 563

(51) Int. Cl.[7] ................................................ B05B 1/08

(52) U.S. Cl. ............................. 239/102.2; 251/129.06; 310/328; 310/326

(58) Field of Search ................. 239/102.2; 251/129.06; 123/498; 310/326, 327, 328

(56) References Cited

U.S. PATENT DOCUMENTS

| | | | | |
|---|---|---|---|---|
| 3,418,980 A | * | 12/1968 | Benson | 123/294 |
| 3,598,506 A | * | 8/1971 | O'Neill | 417/383 |
| 4,553,059 A | * | 11/1985 | Abe et al. | 310/328 |
| 4,814,659 A | * | 3/1989 | Sawada | 310/328 |
| 5,031,841 A | | 7/1991 | Schafer | |
| 5,239,223 A | | 8/1993 | Miyoshi | |
| 5,482,213 A | * | 1/1996 | Matsusaka et al. | 239/584 |

FOREIGN PATENT DOCUMENTS

| | | |
|---|---|---|
| DE | 198 02 495 A1 | 12/1998 |
| DE | 198 58 085 C1 | 3/2000 |
| DE | 198 58 476 A1 | 6/2000 |
| DE | 199 02 260 A1 | 9/2000 |
| DE | 100 16 247 A | 10/2001 |
| JP | 8-275563 | 10/1996 |
| WO | WO 00/52322 A | 9/2000 |
| WO | WO 00/71885 A | 11/2000 |

* cited by examiner

*Primary Examiner*—Dinh Q. Nguyen
(74) *Attorney, Agent, or Firm*—Ronald E. Greigg

(57) ABSTRACT

A piezoelectric actuator module has at least one piezoelectric element, one actuator foot and one actuator head, and is surrounded by an axially extending sleeve. To seal off the piezoelectric actuator module in the axial direction, the actuator foot is adjoined by a diaphragm that extends essentially in the radial direction and is connected to the sleeve.

10 Claims, 3 Drawing Sheets

PIEZOELECTRIC ACTUATOR MODULE

CROSS-REFERENCE TO RELATED APPLICATIONS

This application is a 35 USC 371 application of PCT/DE 02/00517, filed on Feb. 14, 2002.

BACKGROUND OF THE INVENTION

1. Field of the Invention

The invention is based on a piezoelectric actuator module, in particular for an injector in the high-pressure part of an injection system with the "common rail" injection system of a motor vehicle.

2. Description of the Prior Art

One actuator module of the type with which this invention is concerned is known in the industry and can be used in particular in conjunction with common rail injection systems for Diesel engines. The piezoelectric actuator module is assigned a valvelike valve control module and serves to actuate a valve closing body of the valve control module. By means of the valve control module, a nozzle needle of a nozzle module of the injection valve can be actuated in turn. The nozzle needle cooperates with at least one injection opening that leads to a combustion chamber of the engine.

The piezoelectric actuator module typically includes an actuator foot, which is braced on a housing of the injection valve; a piezoelectric element, which undergoes an expansion in length when an electrical voltage is applied; and an actuator head, by way of which the increase in length of the piezoelectric element is transmitted to a so-called adjusting piston in such a way that the adjusting piston is displaced axially. Via a hydraulic coupler embodied as a hydraulic chamber, the adjusting piston cooperates with a so-called actuating piston, which in turn is connected to the valve closing body. Such a construction is also described in German Patent Disclosure DE 199 46 831.

German Patent Disclosure DE 100 43 626 shows a piezoelectric actuator module that is surrounded by an axially extending sleeve, which serves to protect the piezoelectric element from dirt and fuel as well as from damage upon assembly. In the region of the actuator head, the piezoelectric actuator module is sealed off by means of a bellows, which on the one hand allows an actuator stroke and on the other is capable of compensating for a negative coefficient of temperature expansion on the part of the piezoelectric element.

However, bellows have the disadvantage that they require a relatively large amount of space and are expensive.

SUMMARY OF THE INVENTION

The piezoelectric actuator module of the invention in which the actuator foot is adjoined by a diaphragm that extends essentially radially and is connected to the sleeve, has the advantage over the prior art that the diaphragm is extremely low in height and therefore requires only little installation space. Moreover, the costs of the diaphragm are markedly less than those for a bellows.

The diaphragm of the piezoelectric actuator module of the invention is preferably designed such that it can follow along with a displacement of the actuator head of 40 μm, for instance, that results from an increase in length of the piezoelectric element. If the diaphragm seals off the actuator module in the axial direction, then together with the sleeve that radially defines the actuator module it forms a protective sheath for the actuator module. The components in their entirety, that is, the actuator foot, the piezoelectric element, the actuator head, the sleeve, and the diaphragm, thus form a kind of piezoelectric actuator cartridge.

The diaphragm accordingly has the following functions: a sealing function; a temperature compensation function between the piezoelectric element with a negative longitudinal expansion and the sleeve with a positive longitudinal expansion upon heating; and transmitting the actuator stroke (connecting the actuator head and the sleeve).

In an advantageous embodiment, the diaphragm can for instance be made from a spring steel or from a precipitation-hardening material.

An especially secure connection of the diaphragm to the actuator foot can be attained if these two components are welded to one another.

Moreover, the diaphragm can be welded to the sleeve or made in one piece with the sleeve. In both cases, the diaphragm advantageously has a central opening for a tapered region of the actuator foot, for transmitting the increase in length of the piezoelectric element to the at least one piston. In that case, the diaphragm is embodied annularly.

In a preferred embodiment of the piezoelectric actuator module of the invention, the diaphragm, which is embodied annularly, has a curved cross section. In this embodiment, the mechanical stresses acting on the diaphragm in operation are least.

In a variant embodiment, however, the diaphragm can also have a substantially plane shape.

The thickness of the diaphragm in an advantageous version is approximately 0.2 mm, for example.

BRIEF DESCRIPTION OF THE DRAWINGS

Three exemplary embodiments of the piezoelectric actuator module of the invention are described in further detail in the ensuing description, with reference to the drawings, in which.

DESCRIPTION OF THE PREFERRED EMBODIMENTS

Figure 1:
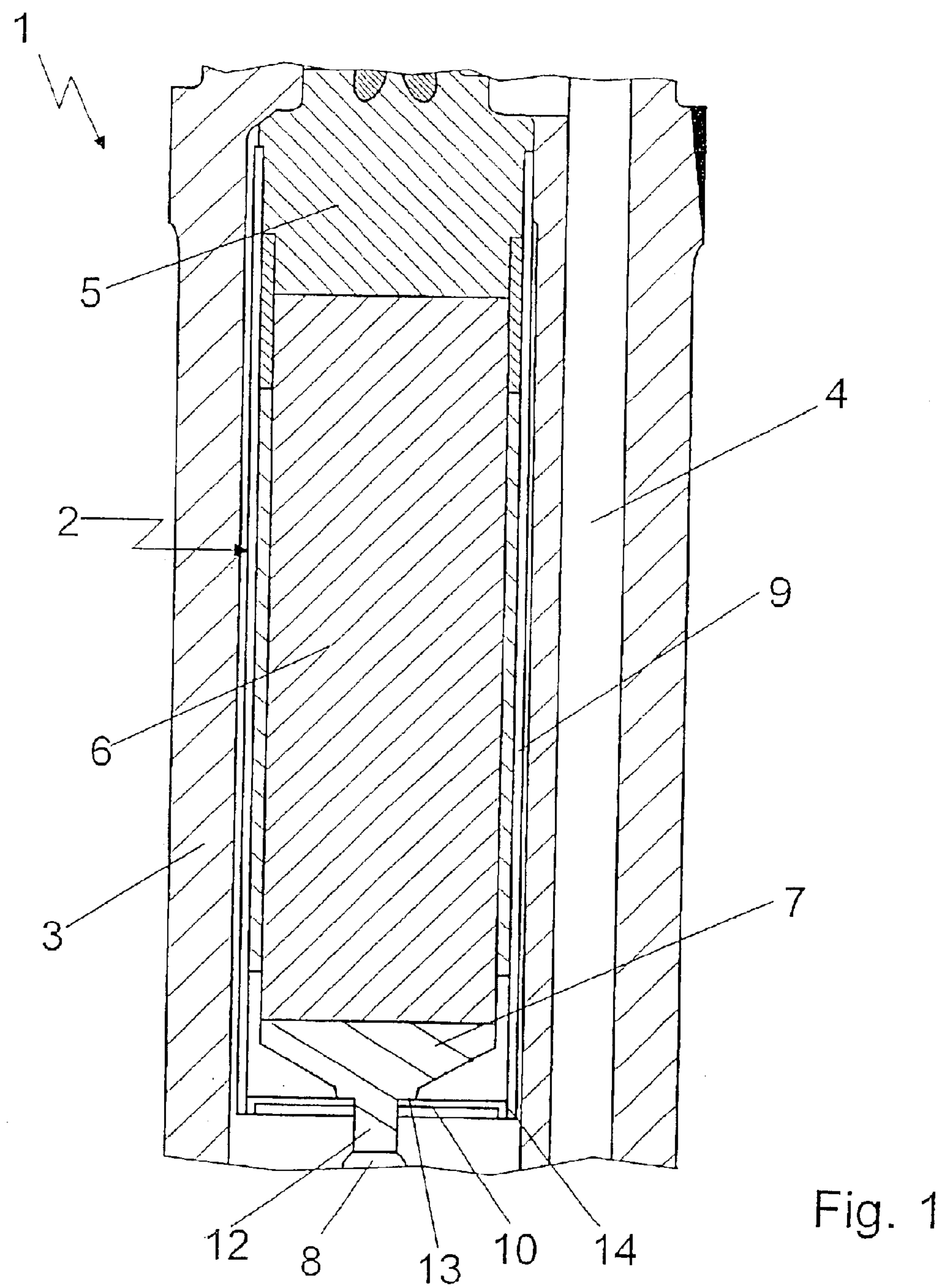
FIG. 1 is a sectional view schematically showing piezoelectric actuator module of the invention, which serves as a triggering unit for an injection valve, in a simplified longitudinal section.
Figure 2:
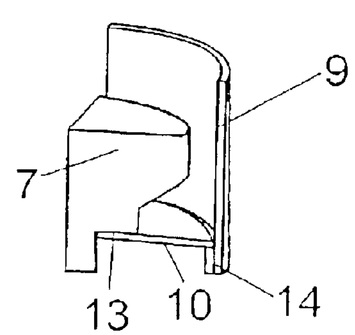
FIG. 2, a perspective view of a detail of an actuator foot region of the actuator module of FIG. 1.

The exemplary embodiment shown in FIGS. 1 and 2 illustrates a portion of a fuel injection system 1, which is intended for installation in an internal combustion engine of a motor vehicle and which is embodied here as a common rail injector for injecting preferably Diesel fuel.

The injector includes an actuator module 2, which is accommodated in a retaining body 3 and is assigned, via a coupler module, to a valvelike valve control module, which serves to actuate a nozzle needle but is disposed in a nozzle module not shown in detail here. Also embodied in the retaining body 3 is a fuel delivery conduit 4 (high-pressure bore), which extends parallel to the actuator module 2 and serves to transport fuel from a common rail storage unit to the nozzle module of the injection valve 1.

The actuator module 2 includes a so-called actuator foot 5, by way of which the actuator module 2 is braced on the retaining body 3; a piezoelectric element 6, adjoining the actuator foot 5 axially, which is made in the usual way of many layers of a piezoelectric material; and a so-called actuator head 7 adjoining the piezoelectric element 6 in the direction remote from the actuator foot 5. The actuator head 7 serves to transmit an increase in length or a contraction of the piezoelectric element 6 to an adjusting piston, known per se and not shown here, of the valve control unit, which is preferably constructed in principle like a valve for controlling fluids described in DE 199 46 831.

Thus the adjusting piston can be operatively in communication in the usual way, via a hydraulic coupler (coupler module) embodied as a hydraulic chamber, with a so-called actuating piston, and the lower actuating piston is preferably connected in turn with a valve closing body that cooperates with a valve seat.

The transmission of the increase in length of the piezoelectric element 6 is effected via a ball 8, serving here as a compensation element. The ball 8 has a diameter of approximately 3 mm, for example.

The piezoelectric actuator module 2 is surrounded here by a substantially cylindrical, thin-walled sleeve 9, which extends in the axial direction and is made for instance of economical stainless steel and which radially seals the actuator module 2.

On the side remote from the actuator foot 5, the piezoelectric actuator module 2 is sealed off in the axial direction by means of a diaphragm 10, formed here of spring steel, which extends essentially in the radial direction, is embodied radially, and has a central opening for a peglike region 12 of the actuator head 7.

By way of example, the diaphragm may have a thickness of 0.08 mm to 0.2 mm, an outside diameter of 9.5 mm, and an inside diameter of 2.5 mm.

The diaphragm 10, whose shape here is essentially plane or platelike, is solidly joined to the actuator head 7, at the inner boundary oriented toward the peglike region 12, via a weld seam 13. At the outer boundary, oriented toward the sleeve 9, the diaphragm 10 is joined to the sleeve 9 via a weld seam 14.

Figure 3:
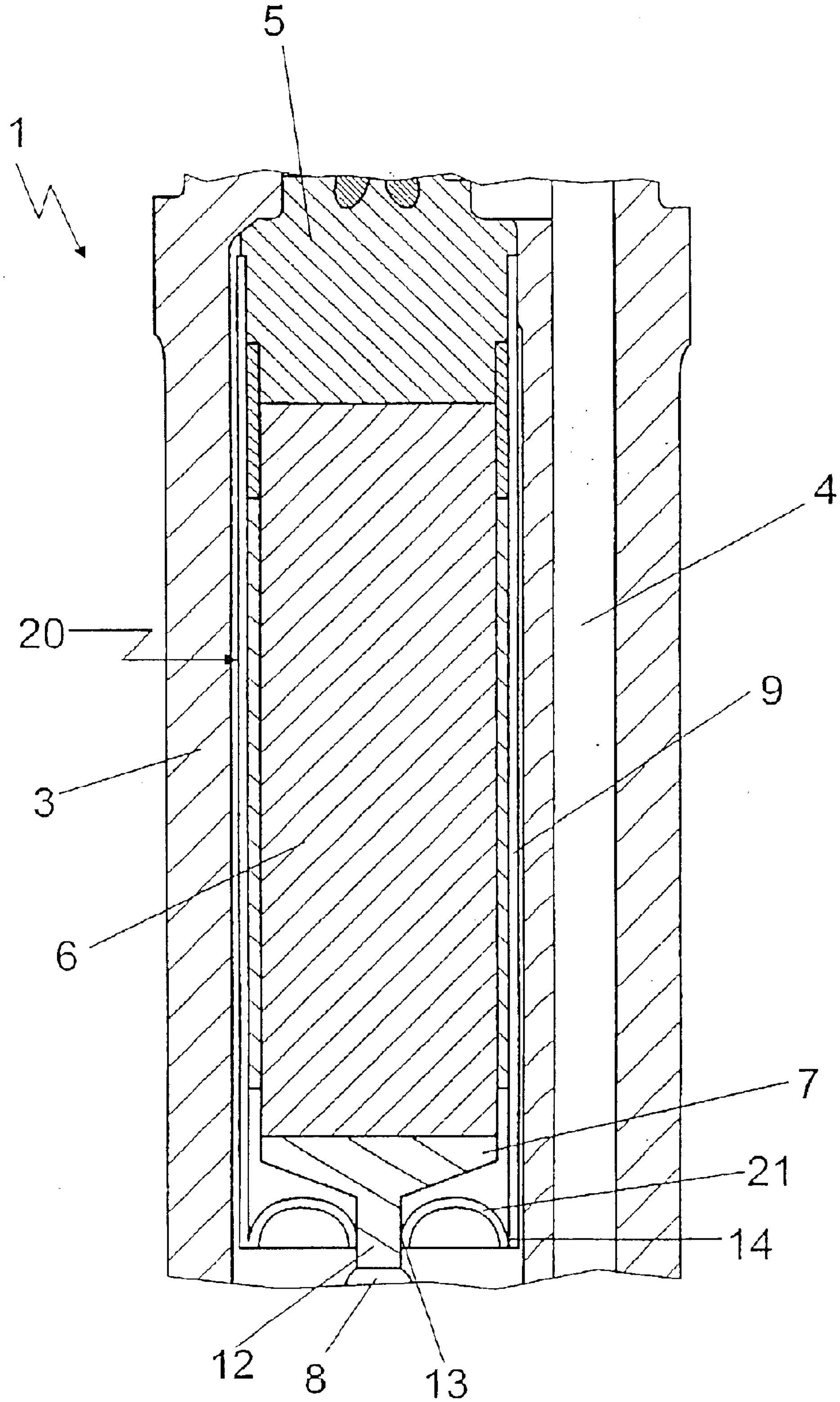
FIG. 3, a second embodiment of the piezoelectric actuator module of the invention, in an injection valve in a view corresponding to FIG. 1.

In FIG. 3, an alternative embodiment of a piezoelectric actuator module 20 is shown. This embodiment differs from that of FIGS. 1 and 2 in having a diaphragm 21 that is curved elliptically to circularly, with the curvature extending in the direction of the piezoelectric element 6. The diaphragm 21, which extends essentially in the radial direction, is likewise embodied annularly and is joined at the inner boundary to the actuator head 7 via a weld seam 13 and at the outer boundary to the sleeve 9 via a weld seam 14. In this embodiment, the mechanical stresses that act on the diaphragm in operation are least.

Figure 4:
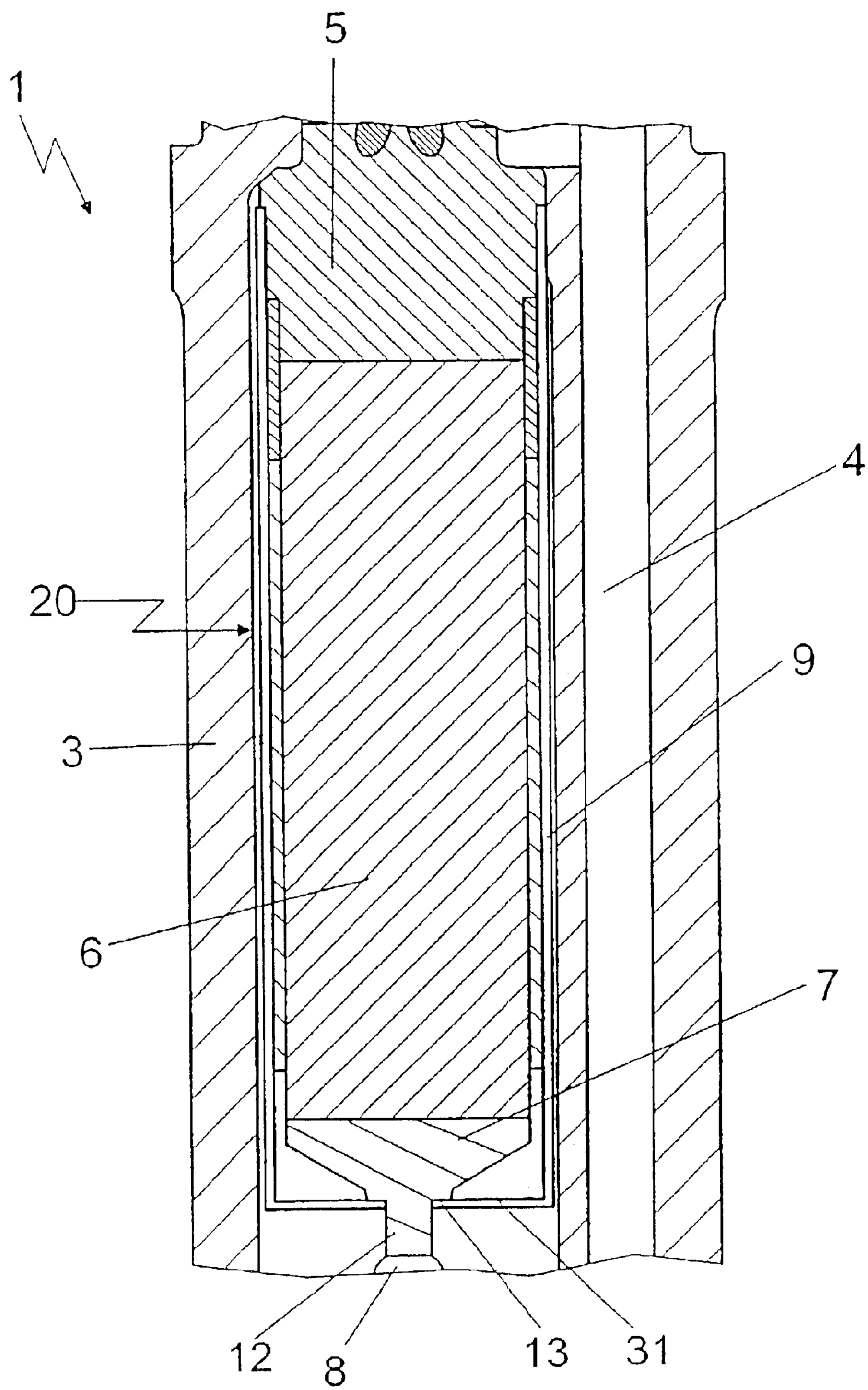
FIG. 4, a third embodiment of a piezoelectric actuator module of the invention, in longitudinal section.

In FIG. 4, a third embodiment of a piezoelectric actuator module 30 of the invention is shown. This embodiment differs from that of FIGS. 1 and 2 in that it has a diaphragm 31 that is made integrally with the sleeve 9 and thus forms a unit with the sleeve 9. The diaphragm 31, which has a flat or plane geometry, is embodied annularly and is joined at its inner boundary to the actuator head 7 via a weld seam 13.

It is understood that the invention is not limited to the embodiments presented here. On the contrary, the diaphragm can have any other conceivable shapes that appear suitable to one skilled in the art for the given application.

Although the described use of the piezoelectric actuator module of the invention in a fuel injection valve is quite advantageous, it is also conceivable for a piezoelectric actuator module designed according to the invention to be used in other areas of application as well, and especially areas in which a piezoelectric element must be protected from dirt or from an aggressive medium.

What is claimed is:

1. A piezoelectric actuator module, comprising at least one piezoelectric element (6), one actuator foot (5) and one actuator head (7), which head cooperates with a component to be actuated by the piezoelectric element (6), a sleeve (9) surrounding the actuator module (2; 20; 30) and extending in the axial direction, and a diaphragm (10; 21; 31) having a central opening, the periphery of the central opening being welded to the actuator head (7), the diaphragm extending essentially in the radial direction and connected to the sleeve (9).

2. The piezoelectric actuator module of claim 1 wherein the diaphragm (10; 21) is welded to the sleeve (9).

3. The piezoelectric actuator module of claim 2 wherein the diaphragm (21) has a curved cross section.

4. The piezoelectric actuator module of claim 2 wherein the diaphragm (10; 31) has an essentially plane geometry.

5. The piezoelectric actuator module of claim 2 connected with forming a triggering unit of a fuel injection valve (1), in particular of a common rail injection valve, of a motor vehicle.

6. The piezoelectric actuator module of claim 1 wherein the diaphragm (31) is manufactured integrally with the sleeve (9).

7. The piezoelectric actuator module of claim 1 wherein the diaphragm (21) has a curved cross section.

8. The piezoelectric actuator module of claim 1 wherein the diaphragm (10; 31) has an essentially plane geometry.

9. The piezoelectric actuator module of claim 1 wherein the diaphragm (10; 21; 31) has a thickness of approximately 0.2 mm.

10. The piezoelectric actuator module of claim 1 connected with forming a triggering unit of a fuel injection valve (1), in particular of a common rail injection valve, of a motor vehicle.

* * * * *